United States Patent
Kashihara et al.

[11] Patent Number: 6,121,699
[45] Date of Patent: Sep. 19, 2000

[54] AC GENERATOR FOR MOTOR VEHICLES

[75] Inventors: Toshiaki Kashihara; Yoshihito Asao, both of Tokyo, Japan

[73] Assignee: Mitsubishi Denki Kabushiki Kaisha, Tokyo, Japan

[21] Appl. No.: 09/193,842

[22] Filed: Nov. 18, 1998

[30] Foreign Application Priority Data

Jun. 5, 1998 [JP] Japan .................................. 10-157664

[51] Int. Cl.⁷ .................................................. H02K 11/00
[52] U.S. Cl. ........................................ 310/68 D; 363/145
[58] Field of Search .................................. 310/68 D, 71, 310/64; 257/796, 658; 363/145

[56] References Cited

U.S. PATENT DOCUMENTS

| | | | |
|---|---|---|---|
| 3,754,169 | 8/1973 | Lyon et al. | 257/658 |
| 3,927,338 | 12/1975 | Vieilleribiere | 310/68 D |
| 3,959,676 | 5/1976 | Striker | 310/68 D |
| 3,970,881 | 7/1976 | Sato | 310/68 D |
| 3,979,659 | 9/1976 | Lynch, Jr. et al. | 363/145 |
| 4,189,653 | 2/1980 | Hiratuka et al. | 310/68 D |
| 4,606,000 | 8/1986 | Steele et al. | 363/145 |
| 4,835,427 | 5/1989 | Bohm et al. | 310/68 D |
| 5,729,063 | 3/1998 | Adachi et al. | 310/68 D |
| 5,828,564 | 10/1998 | Mori et al. | 363/141 |

FOREIGN PATENT DOCUMENTS 8-182279  7/1996  Japan .

*Primary Examiner*—Nestor Ramirez
*Assistant Examiner*—Joseph Waks
*Attorney, Agent, or Firm*—Sughrue, Mion, Zinn, Macpeak & Seas, PLLC

[57] ABSTRACT

A motor vehicle AC generator including a rectifier in which a direct-fitting surface of a negative-polarity side cooling plate is brought closely into contact with a casing direct-fitting surface of a rear bracket and is fixedly tightened with a fitting screw with respect thereto. In addition, a silicone sheet is interposed between the cooling plate and the rear bracket in a state of being located within an intervening member accommodating groove made in the direct-fitting surface of the cooling plate so as to cover an area lying light under a diode except the peripheral bearing surface of the fitting screw. This construction forms an electric conducting portion at which the direct-fitting portion of the cooling plate and the casing direct-fitting surface directly come into contact with each other and further forms a thermal conducting portion at which the direct-fitting surface of the cooling plate and the casing direct-fitting surface come into contact with each other in a state where the silicone sheet is interposed therebetween.

8 Claims, 11 Drawing Sheets

AC GENERATOR FOR MOTOR VEHICLES

BACKGROUND OF THE INVENTION

1. Field of the Invention

The present invention relates to an AC generator for use in motor vehicles, and more particularly to improvement of a rectifier and its associated parts.

2. Description of the Related Art

FIG. 15 is a side-elevational and cross-sectional view showing a construction of a prior motor vehicle AC generator disclosed in, for example, Japanese Unexamined Patent Publication No. 8-182279, FIGS. 16 and 17 are respectively a front elevational view and a rear elevational view each showing a rectifier of the prior motor vehicle AC generator, and FIG. 18 is a cross-sectional view taken along a line XVIII—XVIII of FIG. 16.

The prior motor vehicle AC generator shown in FIG. 15 is composed of a casing 3 comprising a front bracket 1 and a rear bracket 2 each made of aluminium, a shaft 6 rotatably supported by the casing 3 and fixedly holding a pulley 4 at its front bracket 1 side end portion, a lundell type rotor 7 fixedly secured to the shaft 6, fans 5 respectively fixed to both the side surfaces of this rotor 7, a stator 8 fixedly secured to an inner wall surface of the casing 3 so as to surround the rotor 7, a slip ring 9 fixedly secured to a rear-bracket 2 side end portion of the shaft 6 for supplying a current to the stator 8, a pair of brushes 10 housed within a brush holder 11 fixed to the rear bracket 2 and made to slide on the slip ring 9, a rectifier 12 electrically connected to the stator 8 for rectifying an alternating current generated in the stator 8 into a direct current, and a regulator 18 fitted in the brush holder 11 for regulating the magnitude of an alternating current generated in the stator 8.

The rotor 7 is made up of a rotor coil 13 for generating a magnetic flux in response to the flow of a current and a field (pole) core 14 in which a magnetic pole is formed by the magnetic flux generated by the rotor coil 13. Further, the stator 8 is composed of a stator core 15 and a stator coil 16 configured by winding a conductor line around the stator core 15 for producing an alternating current due to the variation of a magnetic flux from the rotor coil 13 in accordance with the rotation of the rotor 7.

In the motor vehicle AC generator thus constructed, a current is supplied from a battery (not shown) through the brush 10 and the slip ring 9 to the rotor coil 13 so that a magnetic flux occurs in the rotor coil 13. A rotational torque of an engine (not shown) is transferred to pulley 4 to rotationally drive the shaft 6, thereby rotating the rotor 7.

Whereupon, a rotating magnetic field is given to the stator coil 16 so that an electromotive force develops in the stator coil 16. This ac electromotive force enters the rectifier 12 to be rectified into a direct current, and after its magnitude is regulated by the regulator 18, is used for charging the battery.

Referring now to FIGS. 16 to 18, a description will be made hereinbelow of a concrete construction of the rectifier 12.

This rectifier 12 comprises a positive-polarity (pole) side cooling plate 21 on which diodes 22 are mounted as positive-polarity side one-way conducting devices, a negative-polarity side cooling plate 23 on which diodes 24 are mounted as negative-polarity side one-way conducting devices, and a circuit board 25.

Furthermore, the positive-polarity side cooling plate 21 is molded out of an aluminium alloy by the die-cast method to have a substantially arc and strip configuration, and its one side is formed as a flat fitting surface 21a while a radiating fin 21b radially protruding is placed on the other side. Overlapping portions 21c are located at both end portions and central portion of the cooling plate 21 in the arcuation directions to extend radially and outwardly, and fixing holes 21d are bored in the overlapping portions 21c. In addition, four diode fitting holes 21e recessed to form a rectangular configuration are radially provided in the fitting surface 21a of the cooling plate 21, and the diodes 22 are soldered therein. On each of the diodes 22, a lead 22a is bent to form an L-shaped configuration, and a base electrode surface thereof is soldered in the diode fitting hole 21e to excellently maintain in an electrically and thermally contacting condition in a state where the lead 22a turns radially and outwardly.

Still further, the negative-polarity side cooling plate 23 is molded in an aluminium alloy according to the die-cast method to have a substantially arc strip configuration with a radius of curvature larger than that of the positive-polarity side cooling plate 21, and its one side is formed as a flat fitting surface 23a while the other side is formed as a flat direct-fitting surface 23b. In this cooling plate 23, fixing holes 23c are bored to overlap with the fixing holes 21d of the cooling plate 21. Further, four diode fitting holes 23d recessed to make a rectangular configuration are radially formed in the fitting surface 23a of the cooling plate 23, and the diodes 24 are soldered therein. On each of the diodes 24, a lead 24a is bent to form an L-shaped configuration, and a base electrode surface thereof is soldered in the diode fitting hole 23d to excellently maintain in an electrically and thermally contacting condition in a state where the lead 24a is directed in a circumferential direction.

Moreover, in the circuit board 25, four connecting terminals 25a made from a steel plate are integrally formed through an insulating material to form a substantially arc and strip configuration, and serve as a relay to electrically establish connections to the stator coil 16, the regulator 18 and the diodes 22, 24. Incidentally, in the illustration, numeral 27 designates an output terminal.

For assembling this rectifier 12 thus constructed, the diodes 22, 24 are first soldered in the diode fitting holes 21e, 23d of the cooling plates 21, 23. Subsequently, the overlapping portions 21c of the cooling plate 21 are overlapped with the cooling plate 23 in a state where an insulating member 28 is interposed therebetween, and the circuit board 25 is placed thereon. Following this, the connecting terminals 25a are connected to the leads 22a, 24a by the spot welding, thereby providing the rectifier 12.

Thereafter, the rectifier 12 thus assembled is inserted into the rear bracket 2, and the direct-fitting surface 23b of the cooling plate 23 is located through a silicone sheet 29a on a direct-fitting surface 2a of the rear bracket 2. In this state, fitting screws 26 are inserted into the fixing holes 21d, 23c and holes 2b made in the rear bracket 2 from the circuit board 25 side and their protruding portions are tightened with fitting nuts 30, respectively, so that the rectifier 12 is attached to the rear bracket 2. At this time, the fixing hole 23c of the cooling plate 23 has a female screw, and when the fitting screw 26 is engaged with the fixing hole 23c, as indicated by an arrow in FIG. 18, a current path is constituted by the fitting screw 26 between the rear bracket 2 and the cooling plate 23.

Besides, in the prior motor vehicle AC generator, although a female screw is made in the fixing hole 23c of the cooling plate 23 and the electric conductivity is secured by the screw coupling between the fitting screw 26 and the fixing hole 23c, it is also acceptable that the electric conductivity is secured by the knurling coupling between the fitting screw and the fixing hole.

Since, as described above, in the prior motor vehicle AC generator, the rectifier 12 is fixedly supported on the rear bracket 2 in a manner that the silicone sheet 29a is put between the entire surface of the direct-fitting surface 23b of the cooling plate 23 and the direct-fitting surface 2a of the rear bracket 2, the whole faying surfaces of the cooling plate 23 and the rear bracket 2 are brought closely into contact with each other in a state where the silicone sheet 29a excellent in thermal conductivity is interposed therebetween, thereby securing the thermal conductivity between the cooling plate 23 and the rear bracket 2.

However, since the silicone sheet 29a has a high insulation performance, the faying surfaces of the cooling plate 23 and the rear bracket do not provide adequate electrical conductivity 2. More specifically, for securing the electric conductivity between the cooling plate 23 and the rear bracket 2, there is a need to provide a female screw in the fixing hole 23c of the cooling plate 23, and to tighten the fitting screw 26 into the fixing hole 23c and further to bring the fitting screw 26 and the rear bracket 2 into contact with each other through the use of a fitting nut. In addition, since an electric conducting medium such as the fitting screw 26 is needed for securing the electric conductivity, a problem occurs in that the electric resistance increases between the cooling plate 23 and the rear bracket 2.

Moreover, although there is a different fitting way to remove the silicone sheet 29a and to directly fay the direct-fitting surface 23b of the cooling plate 23 and the direct-fitting surface 2a of the rear bracket 2 with each other, because the rear bracket is manufactured out of aluminium according to the die-cast method, the surface roughness is as high as 20 to 30 $\mu$m, which makes it difficult to completely and closely bring the cooling plate 23 and the rear bracket 2 into contact with each other without using an intervening member or material, with the result that the thermal conductivity deteriorates. Further, because of no complete close contact between the cooling plate 23 and the rear bracket 2, salt water or dust from the external environment tends to enter there increasing the electric resistance due to the occurrence of rust.

SUMMARY OF THE INVENTION

Accordingly, the present invention has been developed with a view to eliminating the above-mentioned problems, and it is therefore an object of the present invention to provide a motor vehicle AC generator in which an intervening member having an excellent thermal conductivity intervenes in an area at least including an area right under a one-way conducting device between a direct-fitting surface of a cooling plate and a direct-fitting surface of a casing to constitute an electric conducting portion at which the direct-fitting surface of the cooling plate and the direct-fitting surface of the casing directly come into contact with each other and a thermal conducting portion at which the direct-fitting surface of the cooling plate and the direct-fitting surface of the casing come into contact with each other in a state where the intervening member is put therebetween so that the thermal conductivity and electric conductivity between the cooling plate and a bracket are securable.

In order to achieve the above object, according to one aspect of the present invention, there is provided a motor vehicle AC generator comprising a rotor fitted over a shaft rotatably supported within a casing; a stator attached to the casing to surround the rotor; and a rectifier having a positive-polarity side cooling plate, positive-polarity side one-way conducting devices mounted on a fitting surface of the positive-polarity side cooling plate, a negative-polarity side cooling plate and negative-polarity side one-way conducting devices mounted on a fitting surface of the negative-polarity side cooling plate, the rectifier being fixedly tightened with a fitting screw to the casing in a state where a direct-fitting surface of one of positive-polarity side and negative-polarity side cooling plates opposite to the fitting surface thereof is brought closely into contact with a casing direct-fitting surface formed on an inner wall surface of the casing; wherein an intervening member excellent in thermal conductivity is interposed between the direct-fitting surface of the one cooling plate and the casing direct-fitting surface to cover at least an area right under the one-way conducting devices mounted on the fitting surface of the one cooling plate to constitute an electric conducting portion at which the direct-fitting surface of the one cooling plate and the casting direct-fitting surface come directly into contact with each other and a thermal conducting portion at which the direct-fitting surface of the one cooling plate and the casing direct-fitting surface come into contact with each other in a state where the intervening member is interposed therebetween.

DETAILED DESCRIPTION OF THE INVENTION

Embodiments of the present invention will be described hereinbelow with reference to the drawings.

First Embodiment

Figure 1:
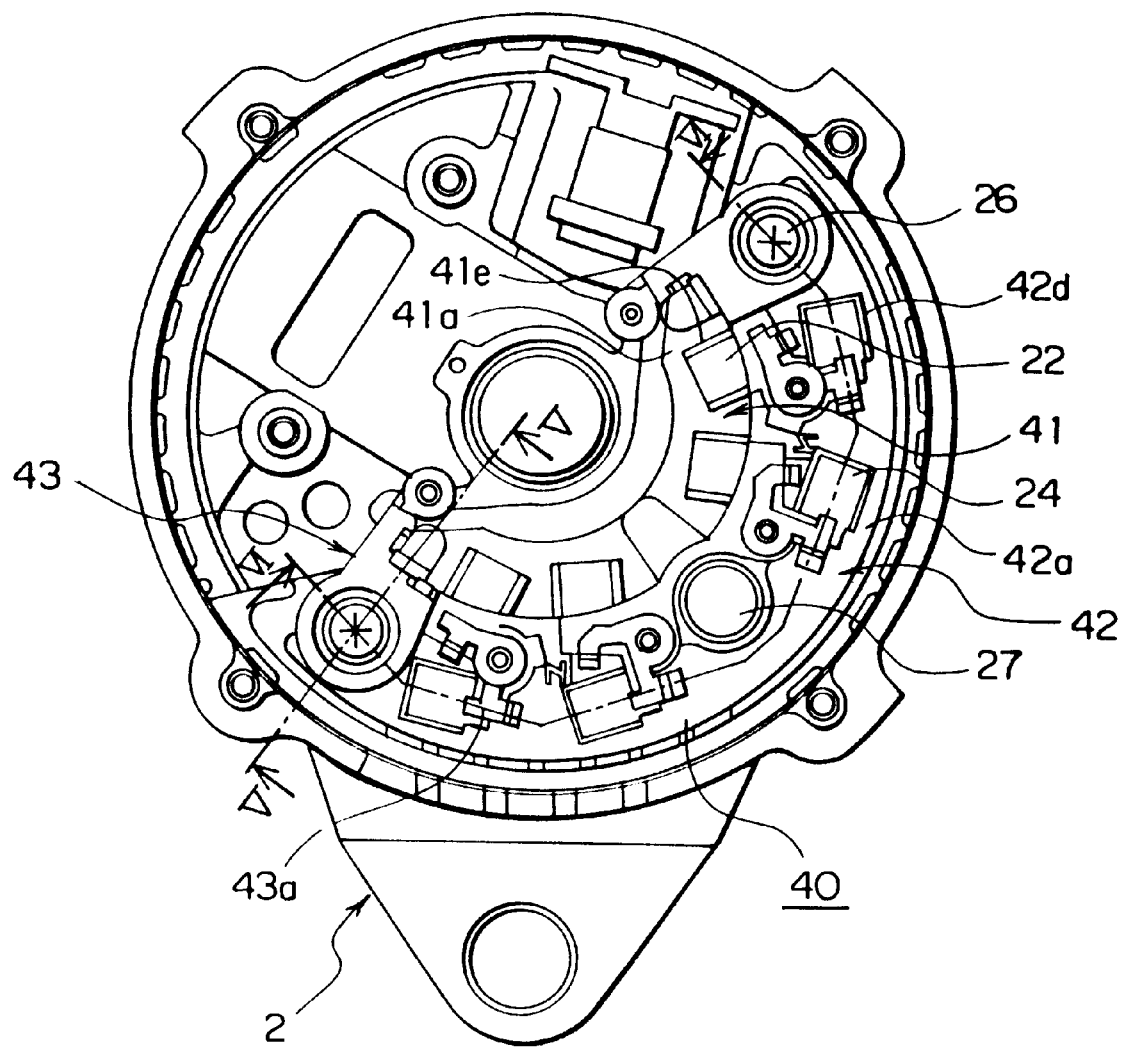
FIG. 1 is a front elevational view showing a rear bracket when a rectifier of a motor vehicle AC generator according to a first embodiment of the present invention is in a mounted condition.
Figure 2:
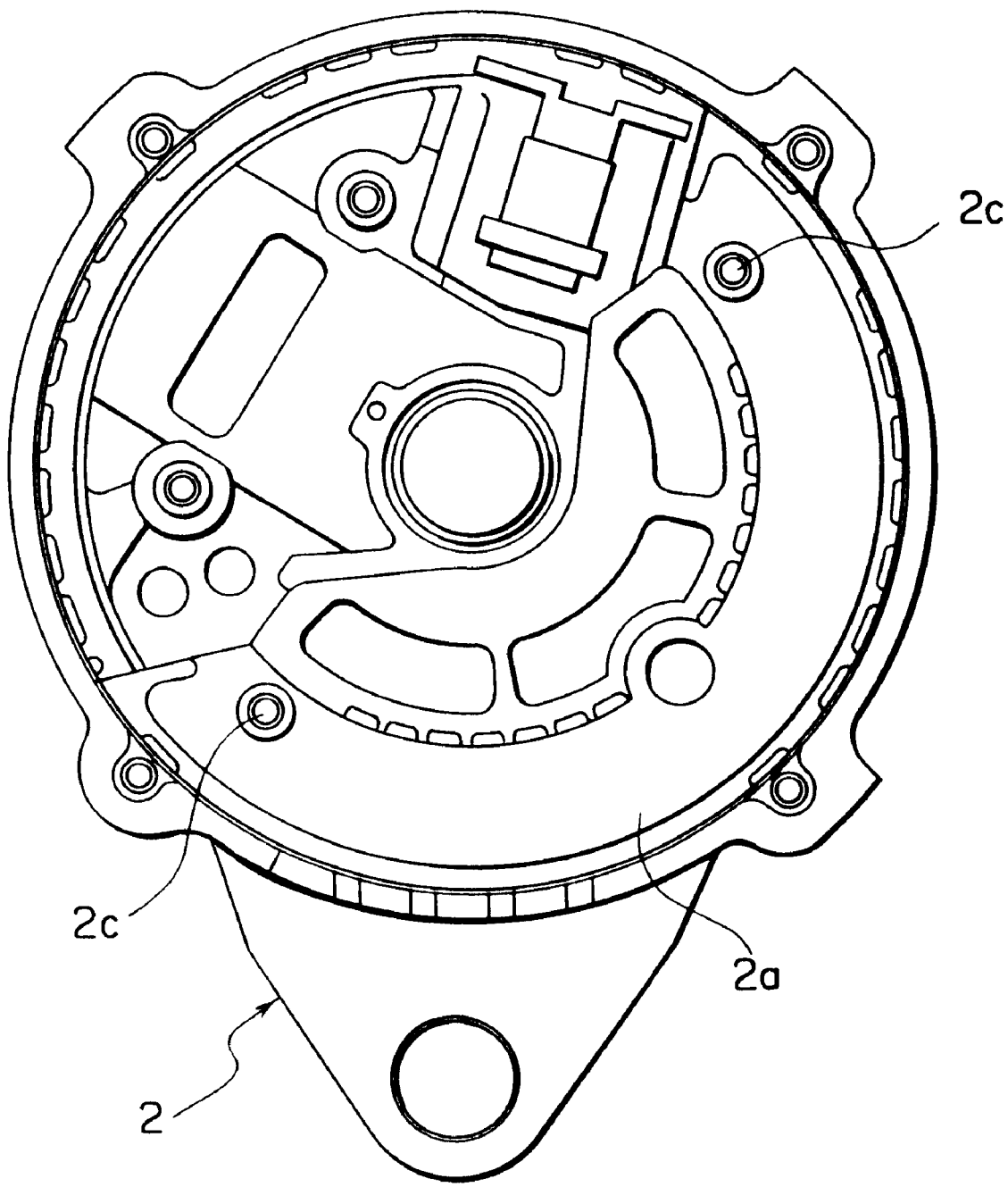
FIG. 2 is a front elevational view showing the rear bracket when the rectifier of the motor vehicle AC generator according to a first embodiment of this invention is in a non-mounted condition.
Figure 3:
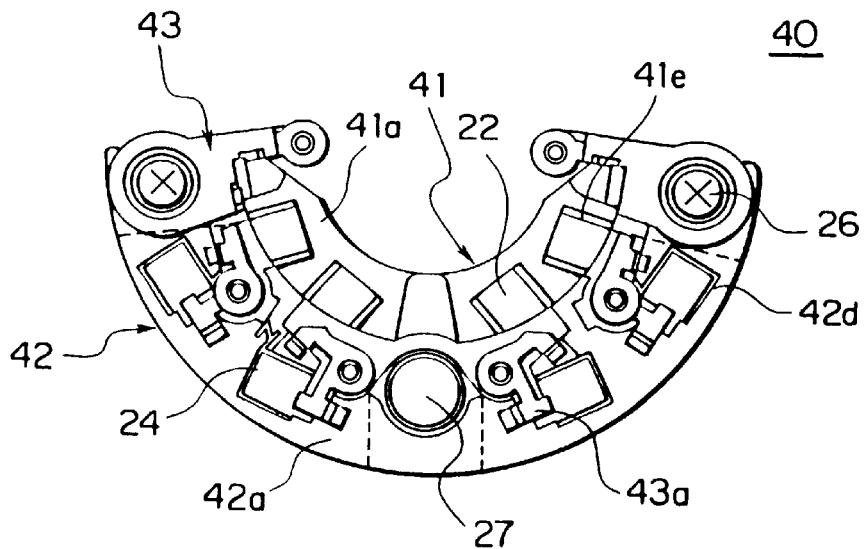
FIG. 3 is a front elevational view showing the rectifier of the motor vehicle AC generator according to the first embodiment of this invention.
Figure 4:
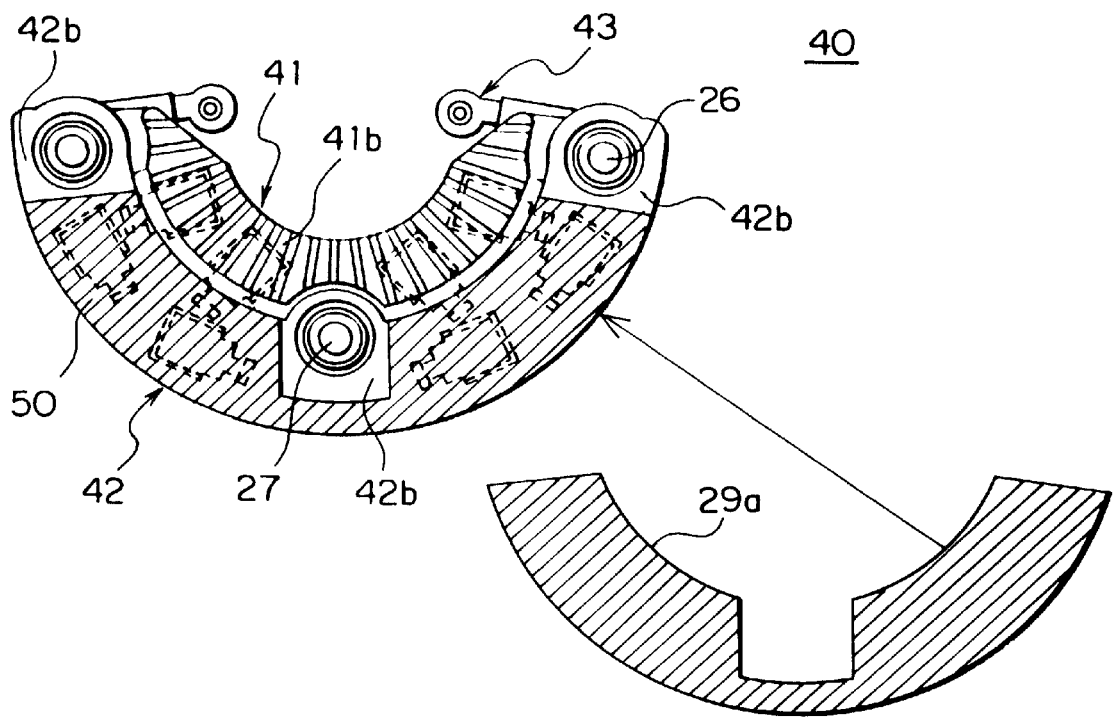
FIG. 4 is a rear elevational view showing the rectifier of the motor vehicle AC generator according to the first embodiment of this invention.
Figure 5:
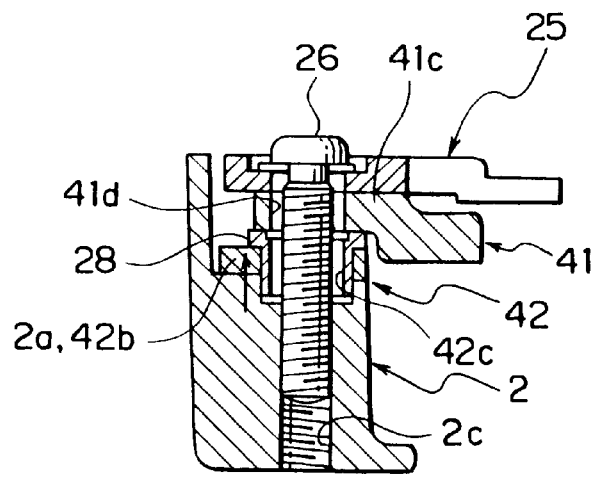
FIG. 5 is a cross-sectional view taken along a line V—V of FIG. 1.
Figure 6:
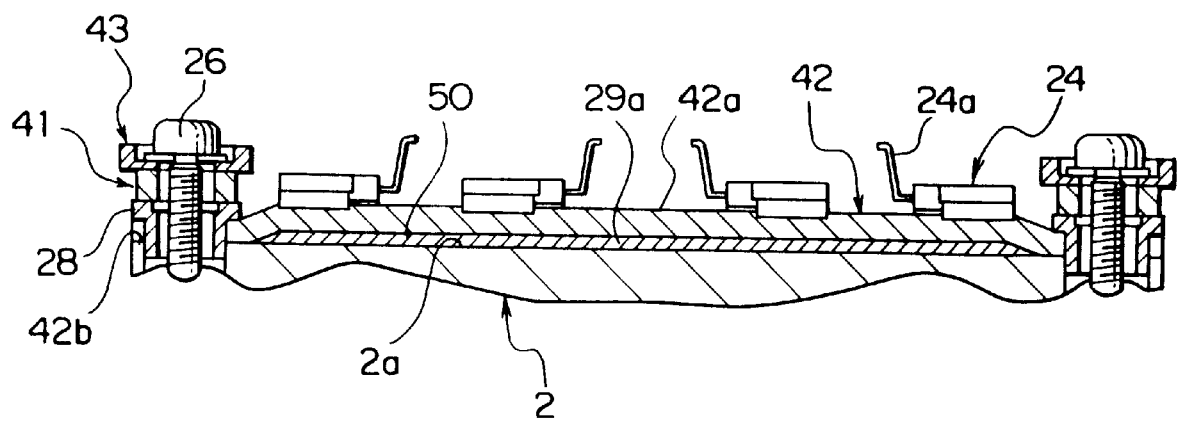
FIG. 6 is a cross-sectional view taken along a line VI—VI of FIG. 1.

FIG. 1 is a front elevational view showing a rear bracket when a rectifier of a motor vehicle AC generator according to a first embodiment of the present invention is in a mounted condition, FIG. 2 is a front elevational view showing the rear bracket when the rectifier of the motor vehicle AC generator according to a first embodiment of this invention is in a non-mounted condition, FIG. 3 is a front elevational view showing the rectifier of the motor vehicle AC generator according to the first embodiment of this invention, FIG. 4 is a rear elevational view showing the rectifier of the motor vehicle AC generator according to the first embodiment of this invention, FIG. 5 is a cross-sectional view taken along a line V—V of FIG. 1, and FIG. 6 is a cross-sectional view taken along a line VI—VI of FIG. 1.

In the illustrations, a rear bracket 2 is equipped with a flat casing direct-fitting surface 2a formed for attachment of a rectifier 40. Further, the rectifier 40 is made up of a positive-polarity side cooling plate 41 on which diodes 22 are mounted as positive-polarity side one-way conducting devices, a negative-polarity side cooling plate 42 on which diodes 24 are mounted as negative-polarity side one-way conducting devices, and a circuit board 43.

In addition, the positive-polarity side cooling plate 41 is molded out of an aluminium alloy according to the die-cast technique to have a substantially arc strip configuration, with one side being formed as a flat fitting surface 41a while the other side is equipped with a radiating fin 41b formed to protrude radially. Further, overlapping portions 41c are formed at both the end portions and central portion of the cooling plate 41 to extend radially and outwardly, and each of the overlapping portions 41c has a fixing hole 41d. Still further, four diode fitting holes 41e recessed rectangularly are radially made in the fitting surface 41a of the cooling plate 41 so that the diodes 22 are soldered therein. On each of the diodes 22, the lead 22a is bent to form an L-shaped configuration, and a base electrode surface thereof is soldered in the corresponding diode fitting hole 41e to excellently maintain an electrically and thermally contacting condition in a state where the lead 22a turns radially and outwardly.

Meanwhile, the negative-polarity side cooling plate 42 is molded in an aluminium alloy according to the die-cast technique to form a substantially arc and strip configuration having a radius of curvature larger than that of the positive-polarity side cooling plate 41, with one side being formed as a flat fitting surface 42a while the other side being formed as a flat direct-fitting surface 42b. In this cooling plate 42, fixing holes 42c are made to overlap with the fixing holes 41d of the cooling plate 41, respectively. In addition, four diode fitting holes 42d recessed rectangularly are formed in the fitting surface 42a of the cooling plate 42 to extend radially, and the diodes 24 are soldered therein, respectively. On each of the diodes 24, the lead 24a is bent to have an L-like configuration, and a base electrode surface thereof is soldered in the corresponding diode fitting hole 42d to excellently keep an electrically and thermally contacting condition in a state where the lead 24a is directed in a circumferential direction. Further, in the direct-fitting surface 42b of the cooling plate 42, an intervening member accommodating groove 50 is recess-formed to accommodate an intervening member having an excellent thermal conductivity except a circumferential portion of a fixing hole 52c. In this case, as the intervening member, there is used a silicone sheet 29a of a coefficient of thermal conductivity: 2.5 kcal/mh °C. and a thickness : 30 $\mu$m. Further, the depth of the intervening member accommodating groove 50 is set to 20 $\mu$m smaller than the thickness of the silicone sheet 29a.

Moreover, in the circuit board 43, four connecting terminals 43a made from a steel plate are integrally formed through an insulating material to form a substantially arc and strip configuration, and serve as a relay to electrically establish connections to the stator coil 13, the regulator 18 and the diodes 22, 24.

For assembling this rectifier 40 thus constructed, the diodes 22, 24 are first soldered in the diode fitting holes 41e, 42d of the cooling plates 41, 42. Subsequently, the overlapping portions 41c of the cooling plate 41 are overlapped with the cooling plate 42 in a state where an insulating member 28 is interposed therebetween, and the circuit board 43 is placed thereon. Following this, the connecting terminals 43a are connected to the leads 22a, 24a by the spot welding, thereby providing the rectifier 40.

Thereafter, the rectifier 40 thus assembled is inserted into the rear bracket 2, and the direct-fitting surface 42b of the cooling plate 42 is located on a direct-fitting surface 2a of the rear bracket 2. At this time, the silicone sheet 29a is put within the intervening member accommodating groove 50 made in the direct-fitting surface 42b of the cooling plate 42. In this state, fitting screws 26 are inserted into the fixing holes 41d, 42c from the circuit board 43 side, and are tightened with screw holes 2c bored in the rear bracket 2, respectively, so that the rectifier 40 is set on the rear bracket 2.

In addition, the stator coil 16 are coupled to the connecting terminals 43a of the circuit board 43, respectively. Further, the cooling plate 41 is electrically coupled through an output terminal 27 to a positive-polarity terminal (not shown) for a motor vehicle battery, whereas the cooling plate 42 is electrically coupled through the rear bracket 2 to a negative (negative-polarity) terminal (not shown) of the motor vehicle battery. This electric circuit arrangement enables the output current rectified in the rectifier 40 to charge the motor vehicle battery.

Besides, the other construction is the same as that of the prior motor vehicle AC generator shown in FIGS. 15 to 18.

In the motor vehicle AC generator thus constructed, the rectifier 40 is firmly fixedly supported on the rear bracket 2 in a manner that the fitting screws 26 are tightened with the screw holes 2c. Further, by tightening the fitting screws 26 with the screw holes 2c, the silicone sheet 29a is compressed until the direct-fitting surface 42b of the cooling plate 42 comes into contact with the direct-fitting surface 2a of the rear bracket 2, and hence, comes closely into contact with the wall surface of the intervening member accommodating groove 50 and the wall surface of the direct-fitting surface 2a of the rear bracket 2. In consequence, as indicated by an arrow in FIG. 5, an electric conducting path due to the direct contact between the direct-fitting surface 42b (the peripheral bearing surfaces of the fitting screw 26 and the output terminal 27) and the direct-fitting surface 2a and further a thermal conducting path due to the contact between the direct-fitting surfaces 42b, 2a through the silicone sheet 29a are formed between the cooling plate 42 and the rear bracket 2.

Accordingly, the heat developed by the electric generation radiates through the fin 41b provided on the cooling plate 41, and further advances through the cooling plate 42 and the silicone sheet 29a to the rear bracket 2 to radiate from a fin of the rear bracket 2. In addition, the cooling plate 42 is electrically coupled through the rear bracket 2 to the negative terminal of the motor vehicle battery.

According to this first embodiment, the silicone sheet 29a is put within the intervening member accommodating groove 50 made in the direct-fitting surface 42b except the peripheral bearing surfaces of the fitting screws 26 and the output terminal 27 and the rectifier 40 is fixedly set on the rear bracket 2, and therefore, the electric conducting path and the thermal conducting path certainly develop between the cooling plate 42 and the rear bracket 2. As a result of this construction, the heat generated by the electric generation can effectively radiate to suppress the rise in the temperatures of the diodes 22, 24, and the cooling plate 42 can surely be electrically coupled to the negative terminal of the motor vehicle battery and the output current rectified in the rectifier 40 causes the charging of the motor vehicle battery.

In addition, because of the formation of the intervening member accommodating groove 50, the assembling and positioning of the silicone sheet 29a becomes easy to improve the assembly efficiency.

Furthermore, since the direct contact between the direct-fitting surfaces 42b, 2b organizes the electric conducting path, the electric resistance decreases between the cooling plate 42 and the rear bracket 2. Still further, a general-purpose screw can be taken as the fitting screw 26 and the use of the fitting screw 30 is unnecessary, which reduces the number of parts and improves the assembly efficiency.

Moreover, since the silicone 29a is located in an area right under a diode 24 of the direct-fitting surface 42b, the heat generated in the diodes 24 can effectively be transferred to the rear bracket 2, thus suppressing the rise in the temperatures of the diodes 24.

The motor vehicle AC generator according to the first embodiment was manufactured and a motor vehicle AC generator in which the direct-fitting surface 42b of the cooling plate 42 and the direct-fitting surface 2a of the rear bracket 2 are fitted to each other without no intervention of the silicone sheet 29a was also manufactured as a comparative example, and the rise in the temperature of the diode 24 was measured through the use of both the motor vehicle AC generators. As the results of the temperature measurement, in the case of the motor vehicle AC generator according to the first embodiment, the temperature of the diode 24 came down by 10 degrees as compared with the motor vehicle AC generator being the comparative example. Incidentally, in this case, the surface roughness Rz of the direct-fitting surface 42b (the intervening member accommodating groove 50) of the cooling plate 42 was set to be 10 μm, the surface roughness Rz of the direct-fitting surface 2a of the rear bracket 2 was set to 20 μm, and further, the silicone sheet 29a was made so that its coefficient of thermal conductivity was 2.5 kcal/mh °C. and its thickness was 30 μm.

This is because, in the case of the comparative example, the surface roughness of the cooling plate and the rear bracket is low and air poor in thermal conductivity intervenes between the cooling plate and the rear bracket. That is, the coefficient of thermal conductivity of air is 0.0221 kcal/mh °C. (in the standard condition of 20° C. and 1 kg/cm$^2$) which makes difficulty the transfer of heat, and hence, difficulty is encountered to effectively transfer the generated heat to the rear bracket.

Besides, although in the above-described first embodiment the description is not made of the material of the fitting screws 26, the fitting screws are not required to have an electric conductivity, and therefore, a material with no electric conductivity can be used for the fitting screws 26.

In addition, although in the above-described first embodiment the silicone sheet 29a is used as the intervening member, it is also possible to use a material such as a silicone grease and a copper foil as long as it has an excellent thermal conductivity.

Second Embodiment

Figure 7:
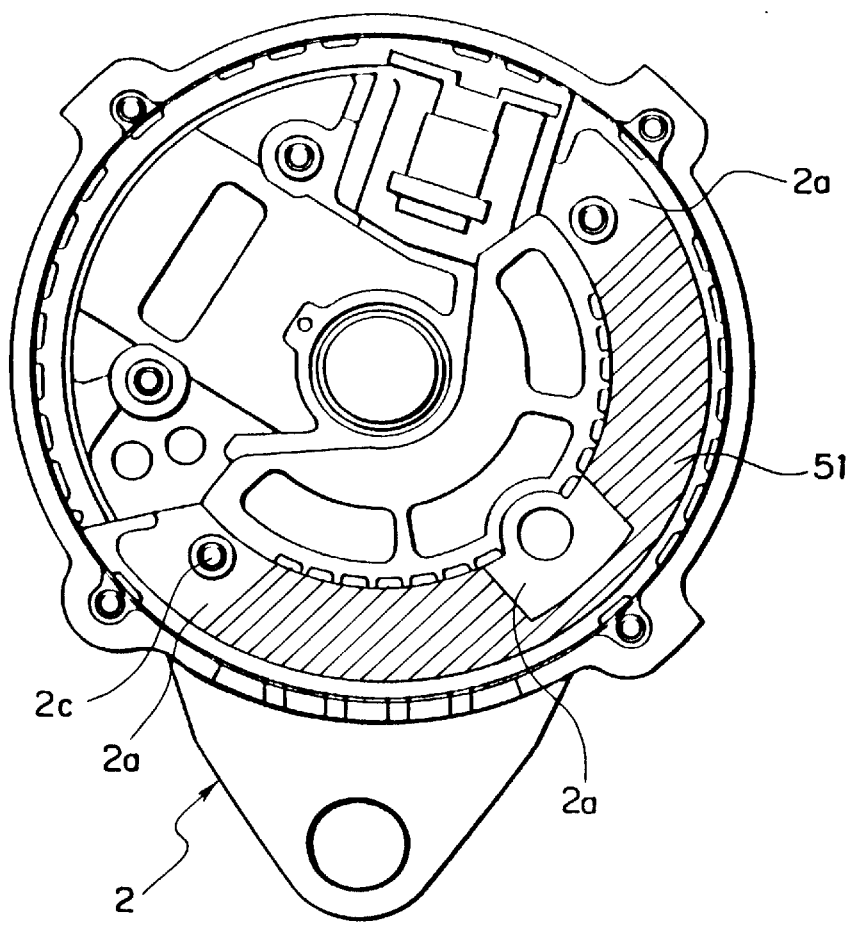
FIG. 7 is a front elevational view showing a rear bracket when a rectifier of a motor vehicle AC generator according to a second embodiment of this invention is in a non-mounted condition.
Figure 8:
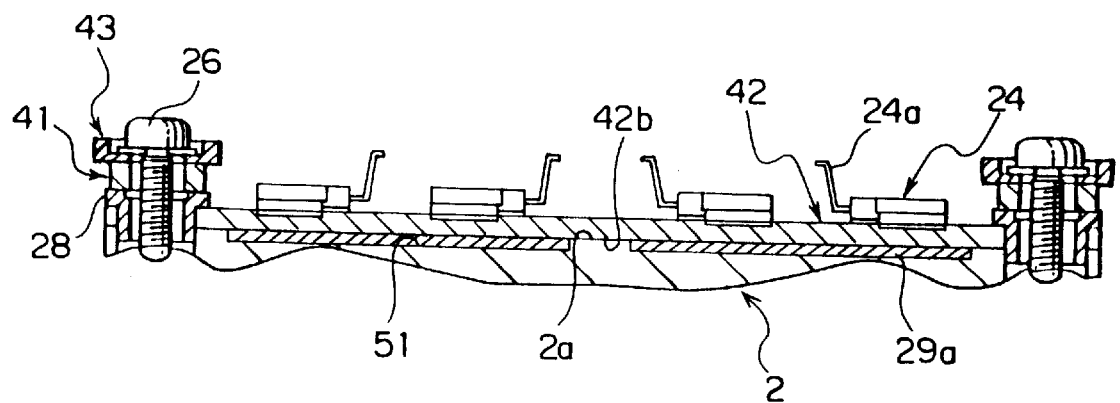
FIG. 8 is a cross-sectional view showing a principal portion of the rectifier of the motor vehicle AC generator according to the second embodiment of this invention, and is an illustration for explaining a mounted condition of the rectifier.

One difference of a second embodiment of this invention from the above-described first embodiment in which the intervening member accommodating groove 50 is made in the direct-fitting surface 42b of the negative-polarity cooling plate 42 is that an intervening member accommodating groove 51 is made in the direct-fitting surface 2a of the rear bracket 2 as shown in FIGS. 7 and 8. This intervening member accommodating groove 51 is located in the direct-fitting surface 2a other than a portion facing the circumferential portion of the fixing hole 52c.

The other construction is the same as that of the above-described first embodiment.

In the second embodiment, the silicone sheet 29a is placed within the intervening member accommodating groove 51 made in the direct-fitting surface 2a except the bearing surfaces of the fitting screws 26 and the output terminal 27 and the rectifier 40 is fixedly mounted on the rear bracket 2, and therefore an electric conducting path and a thermal conducting path can certainly be defined between the cooling plate 42 and the rear bracket 2, so that the effects as those of the above-described first embodiment are obtainable.

In addition, according to the second embodiment, since the intervening member accommodating groove 51 is placed in the direct-fitting surface 2a of the rear bracket 2, the rectifier 40 can be incorporated into the rear bracket 2 in a state where the silicone sheet 29a is housed within the intervening member accommodating groove 51 of the rear bracket 2, so that the positioning of the silicone sheet 29a becomes easy. Further, the silicone sheet 29a is set in a stable condition, and the positional departure of the silicone sheet 29a does not occur, so that the assembly efficiency is improvable.

Furthermore, in the above-described first embodiment, the intervening member accommodating groove 50 is made in the cooling plate 42, and hence, the rigidity of the cooling plate 42 against the bending stress decreases. Thus, the tightening force of the fitting screws applied at the setting of the rectifier 40 microscopically deforms the cooling plate 42. The stress resulting from this microscopic deformation works on the soldering portion between the diode 24 and the cooling plate 42 to cause damages of the diode 24 or cause cracks on the soldering portion. Further, in case that cracks occur in the soldering portion, difficulty is experienced to effectively transfer the generated heat to the rear bracket 2, with the result that the temperature of the diode 24 excessively rises.

On the other hand, according to the second embodiment, since the intervening member accommodating groove 51 is made in the rear bracket 2, it is possible to suppress the decrease in the rigidity of the cooling plate 42 against the bending stress. Accordingly, the microscopic deformation of the cooling plate 42 due to the tightening force of the fitting screw 26 working at the incorporation of the rectifier 40 is suppressible, thus preventing the occurrences of damage of the diode 24 and cracks on the soldering portion resulting from the tightening force of the fitting screw 26.

Third Embodiment

Figure 9:
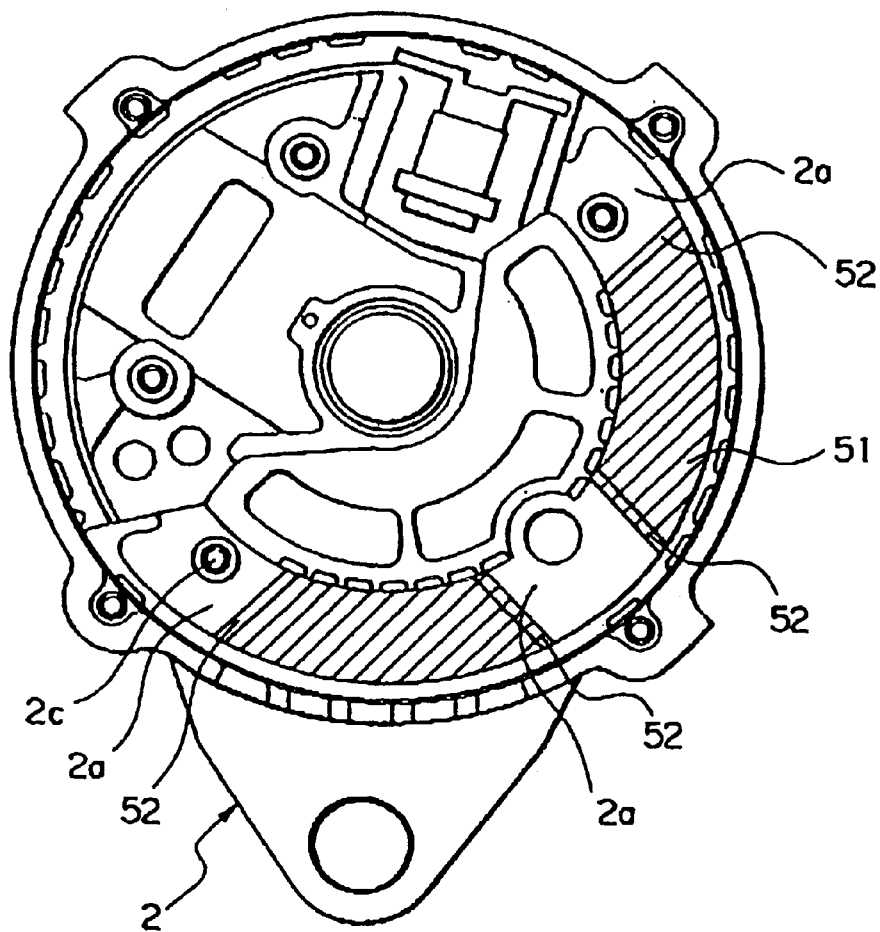
FIG. 9 is a front elevational view showing a rear bracket when a rectifier of a motor vehicle AC generator according to a third embodiment of this invention is in a non-mounted condition.
Figure 10:
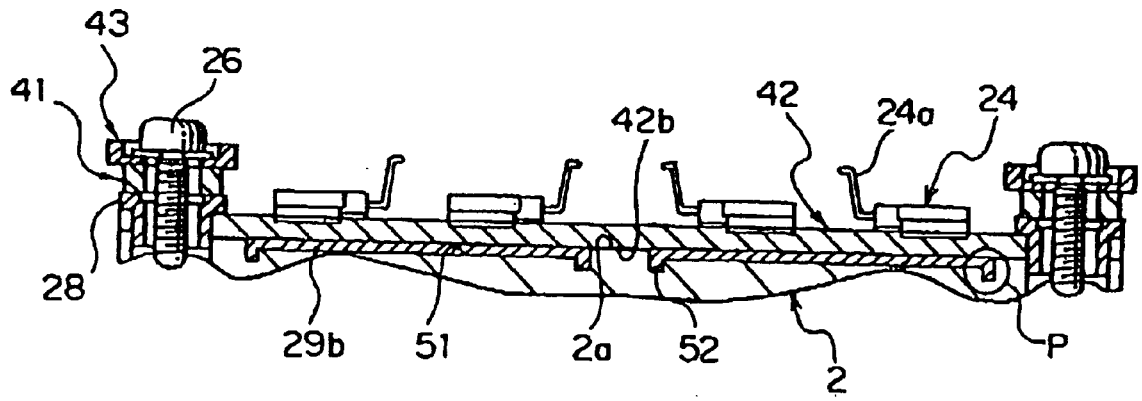
FIG. 10 is a cross-sectional view showing a principal portion of the rectifier of the motor vehicle AC generator according to the third embodiment of this invention, and is an illustration for explaining a mounted condition of the rectifier.
Figure 11:
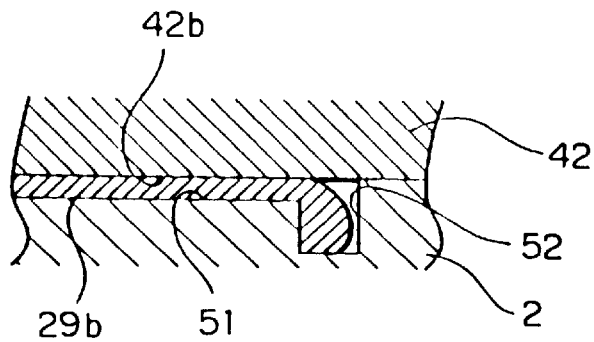
FIG. 11 is an enlarged cross-sectional view showing a portion indicated by character P in the motor vehicle AC generator shown in FIG. 10.

Although in the above-described second embodiment the intervening member accommodating groove 51 is made in the direct-fitting surface 2a of the rear bracket 2, in a third embodiment, as shown in FIGS. 9 to 11, an intervening member accommodating groove(s) 51 is made in the direct-fitting surface 2a of the rear bracket 2 and further an intervening member clearance (escape) groove 52 is made around (in the outer circumference of) the intervening member accommodating groove 51. This intervening member clearance groove 52 is deeper than the intervening member accommodating groove 51, for example, is made to have a depth of 1 mm.

The other construction is the same as that of the second embodiment.

In the third embodiment, a silicone grease 29b serving as an intervening member is put within the intervening member accommodating groove 51 and, thereafter, the rectifier 40 is set to the rear bracket 2. Further, by the tightening of the fitting screws 26, the silicone grease 29b is pressed against the direct-fitting surface 42b of the cooling plate 42 and hence, the intervening member accommodating groove 51 is equally filled with the silicone grease 29b. At this time, if the silicone grease 29b is excessively put therein, as shown in FIG. 11, the extra silicone grease 29b flows into the intervening member clearance groove 52.

As described above, according to the third embodiment, since the silicone grease 29b is used as the intervening member, when the rectifier 40 is set onto the rear bracket 2, the silicone grease 29b can fully come into contact with the wall surface of the intervening member accommodating groove 51 and the direct-fitting surface 2a of the rear bracket 2 to enhance the thermal conductivity between the cooling plate 42 and the rear bracket 2.

In addition, even if the silicone grease 29b is excessively placed therein, the extra silicone grease 29b flows into the intervening member clearance groove 52, thereby preventing the flow-out of the silicone grease 29b into the direct contacting portion (the electric conducting portion) between the direct-fitting surface 42b (the peripheral bearing surfaces of the fitting screw 26 and the output terminal 27) and the direct-fitting surface 2a. In consequence, even if the silicone grease 29b is used as the intervening member, an electric conducting path due to the direct contact between the direct-fitting surface 42b (the peripheral bearing surfaces of the fitting screw 26 and the output terminal 27) and the direct-fitting surface 2a and a thermal conducting path due to the contact between the direct-fitting surfaces 42b, 2a through the silicone grease 29b certainly develops between the cooling plate 42 and the rear bracket 2.

Accordingly, in the case of the third embodiment, vis-a-vis the above-described first and second embodiments, the maintenance against the penetration of the silicone grease 29b into the electric conducting portion becomes easy, so that the assembly efficiency is accordingly improvable.

Although in the above-described third embodiment the silicone grease 29b is used as the intervening member, it is also appropriate to use a silicone sheet 29a or a copper foil as the intervening member, and in this case, the same effects are obtainable.

In addition, although in the above-described third embodiment the intervening member accommodating groove 51 and the intervening member clearance groove 52 are made in the direct-fitting surface 2a of the rear bracket 2, it is also possible that they are made in the direct-fitting surface 42b of the cooling plate 42. Further, it is also appropriate that the intervening member accommodating groove 51 is made in one of the direct-fitting surfaces 2a, 42b while the intervening member clearance groove 52 is made in the other.

Fourth Embodiment

Figure 12:
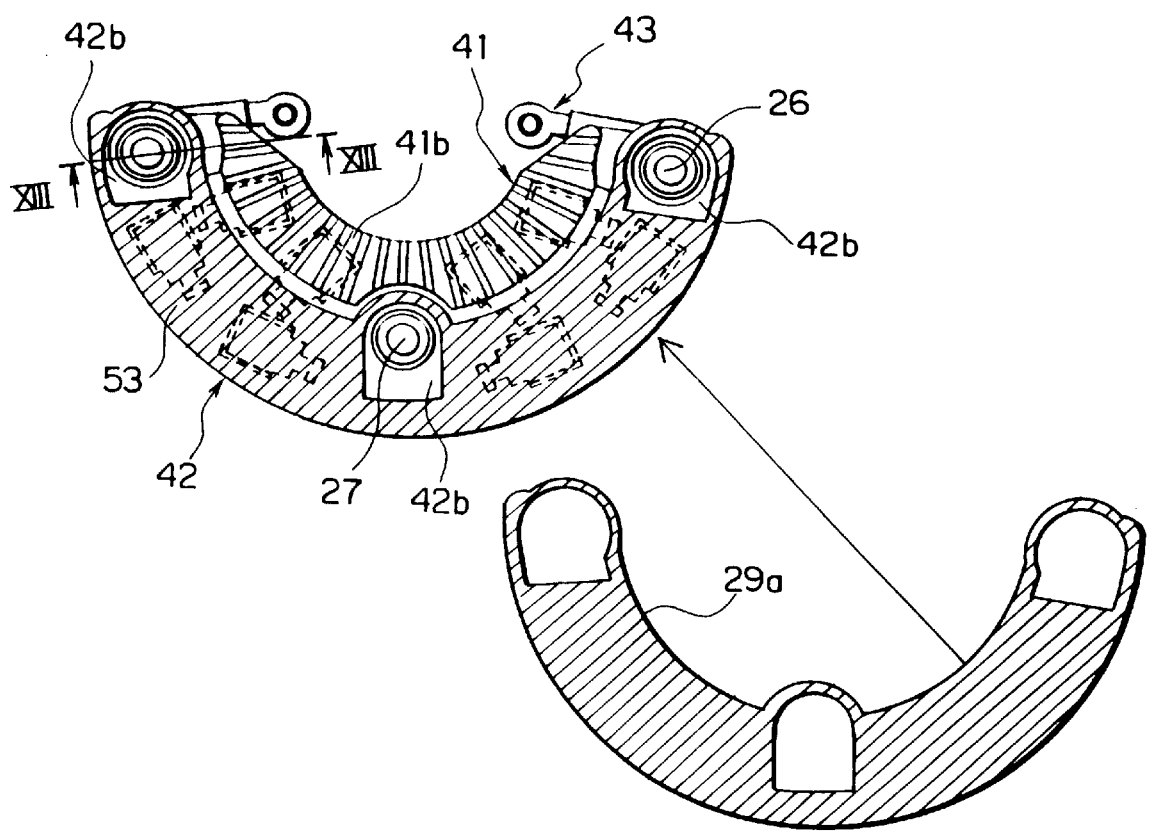
FIG. 12 is a rear elevational view showing a rectifier of a motor vehicle AC generator according to a fourth embodiment of this invention.
Figure 13:
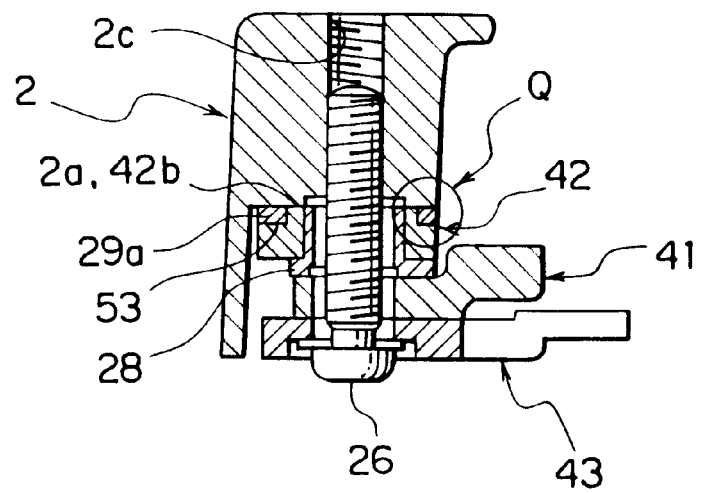
FIG. 13 is a cross-sectional view taken along a line XIII—XIII of FIG. 12.
Figure 14:
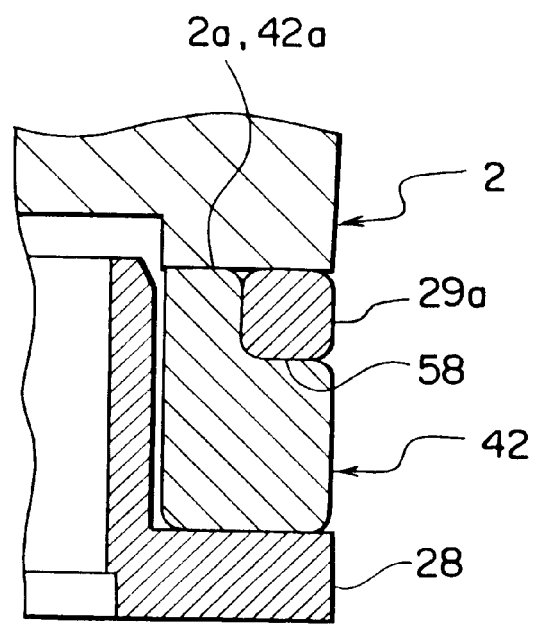
FIG. 14 is an enlarged cross-sectional view showing a portion indicated by character Q in the motor vehicle AC generator shown in FIG. 13.
Figure 15:
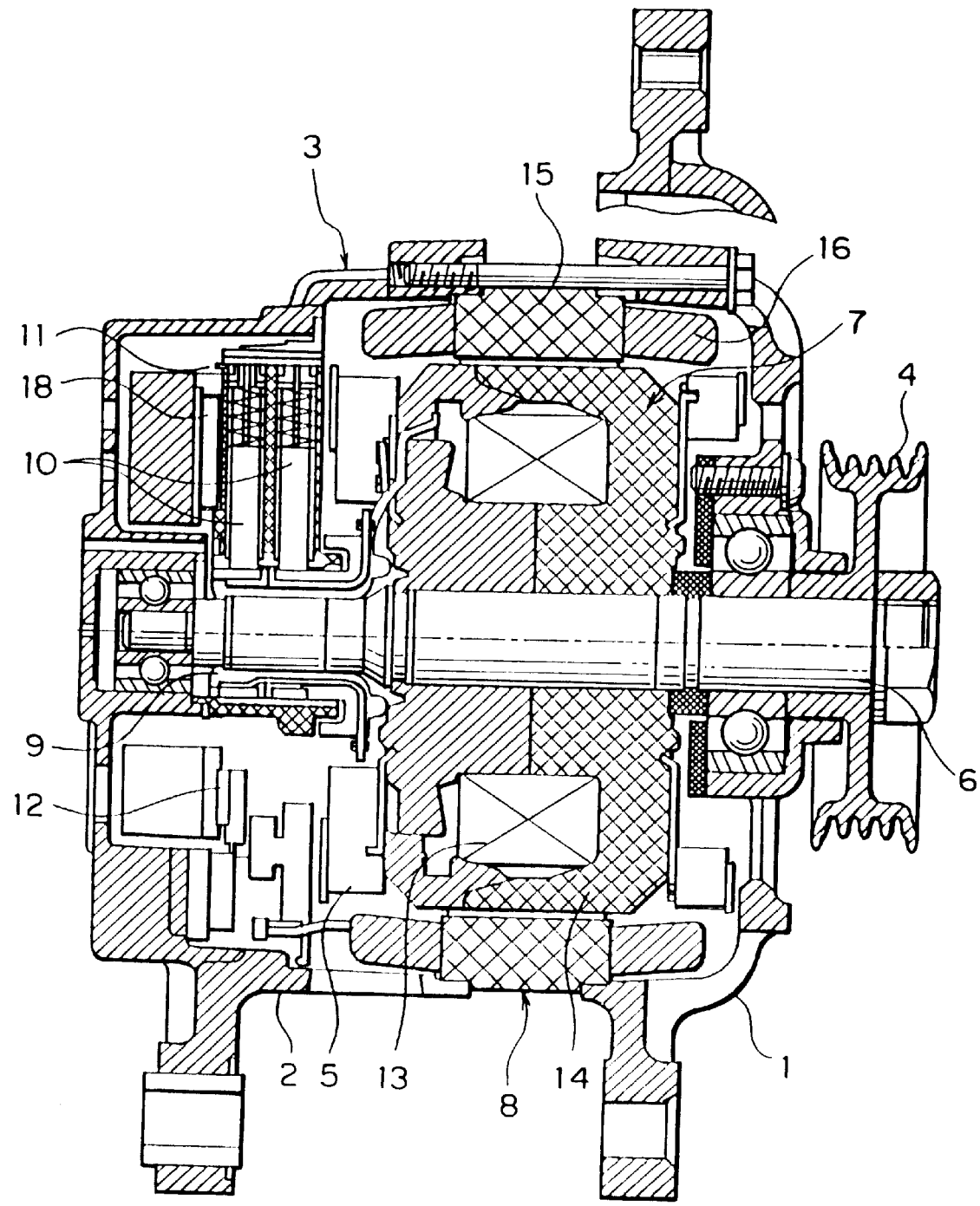
FIG. 15 is a side-elevational and cross-sectional view showing a construction of a prior motor vehicle AC generator.
Figure 16:
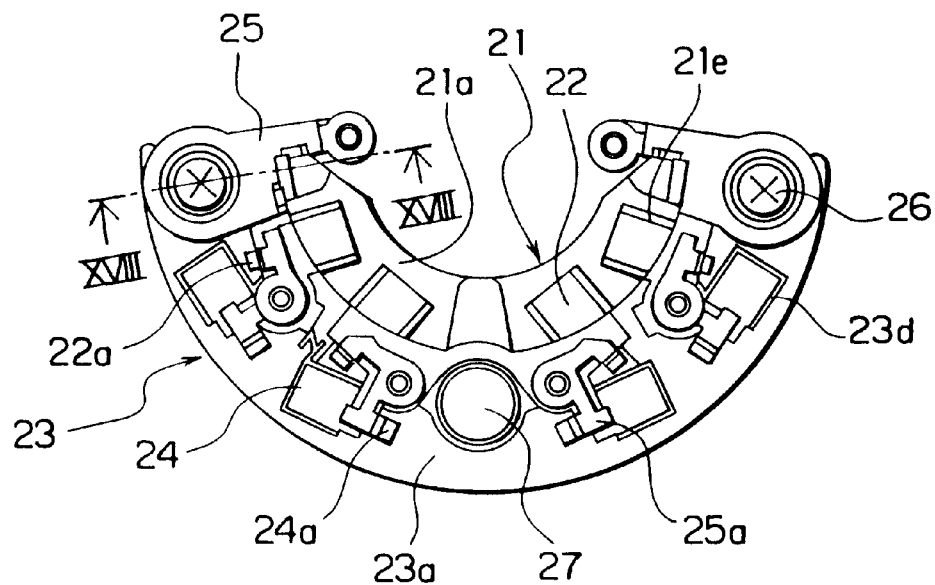
FIG. 16 is a front elevational view showing a rectifier of the prior motor vehicle AC generator.
Figure 17:
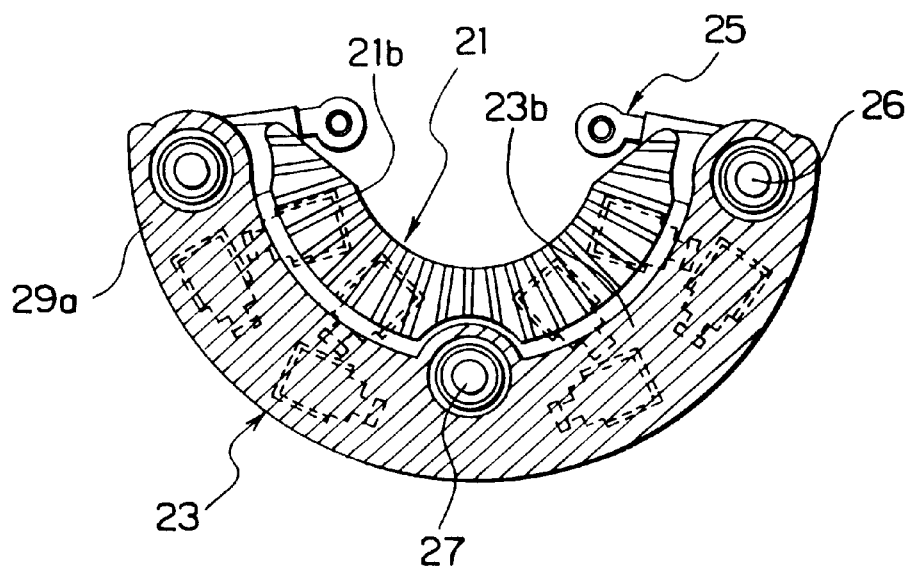
FIG. 17 is a rear elevational view showing the rectifier of the prior motor vehicle AC generator.
Figure 18:
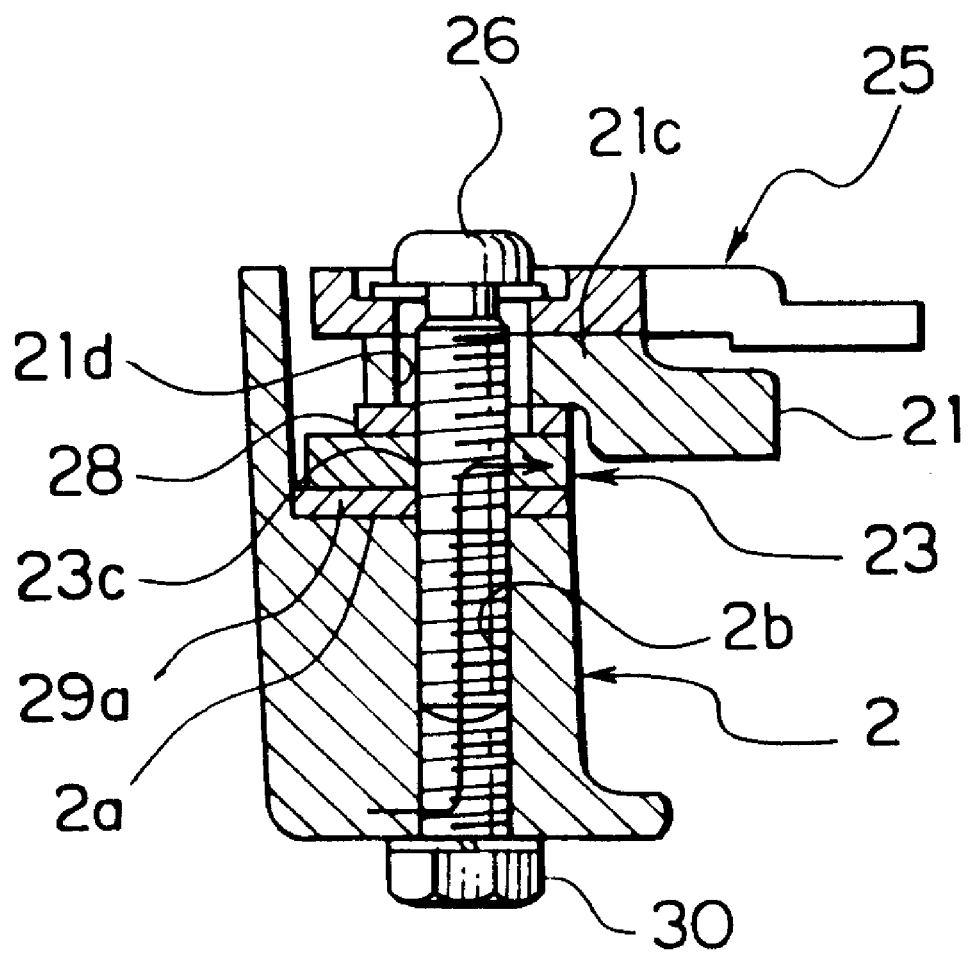
FIG. 18 is a cross-sectional view taken along a line XVIII—XVIII of FIG. 16.

In a fourth embodiment, as shown in FIGS. 12 to 14, an intervening member accommodating groove 53 is made in the direct-fitting surface 42b of the cooling plate 42 to surround the peripheral bearing surfaces of the fitting screw 26 and the output terminal 27, and the silicone sheet 29a is formed to substantially have the same external configuration as that of the intervening member accommodating groove 53.

The other construction is the same as that of the above-described first embodiment.

According to this fourth embodiment, since the direct contacting portion (the electric conducting portion) between the direct-fitting surface 42b (the peripheral bearing surfaces of the fitting screw 26 and the silicone sheet 29a) and the direct-fitting surface 2a is cut off from the external, the invasion of salt water or dust from the external becomes difficult, with the result that the deterioration of the electric resistance due to the rust or the like is preventable.

Incidentally, although in the fourth embodiment the intervening member accommodating groove 53 is provided in the direct-fitting surface 42b of the cooling plate 42, even if the intervening member accommodating groove 53 is provided in the direct-fitting surface 2a of the rear bracket 2, the same effects are attainable.

In addition, although in the fourth embodiment the silicone sheet 29a is used as the intervening member, it is also appropriate that the silicone grease 29a is used as the intervening member.

Moreover, although in the above-described embodiments the description has been made of the negative-polarity side grounded type motor vehicle AC generator in which the negative-polarity side cooling plate 42 is electrically coupled to the rear bracket 2, it is also possible that this invention is applied to a motor vehicle AC generator in which the positive-polarity side cooling plate 41 is electrically coupled to the rear bracket 2, and in this case, the same effects are obtainable.

The present invention, arranged as described above, can offer the following effects.

This invention provides a motor vehicle AC generator comprising a rotor fitted over a shaft rotatably supported within a casing; a stator attached to the casing to surround the rotor; and a rectifier having a positive-polarity side cooling plate, positive-polarity side one-way conducting devices mounted on a fitting surface of the positive-polarity side cooling plate, a negative-polarity side cooling plate and negative-polarity side one-way conducting devices mounted on a fitting surface of the negative-polarity side cooling plate, the rectifier being fixedly tightened with a fitting screw to the casing in a state where a direct-fitting surface of one of positive-polarity side and negative-polarity side cooling plates opposite to the fitting surface thereof is brought closely into contact with a casing direct-fitting surface formed on an inner wall surface of the casing; wherein an intervening member excellent in thermal conductivity is interposed between the direct-fitting surface of the one cooling plate and the casing direct-fitting surface to cover at least an area right under the one-way conducting devices mounted on the fitting surface of the one cooling plate to constitute an electric conducting portion at which the direct-fitting surface of the one cooling plate and the casting direct-fitting surface come directly into contact with each other and a thermal conducting portion at which the direct-fitting surface of the one cooling plate and the casing direct-fitting surface come into contact with each other in a state where the intervening member is interposed therebetween. With this construction, a motor vehicle AC generator in which a thermal conductivity and an electric conductivity are securable in the fitting portion between one cooling plate and the casing is attainable.

In addition, the intervening member is interposed between the direct-fitting surface of the one cooling plate and the casing direct-fitting surface so that the thermal conducting portion surrounds the electric conducting portion, with the result that the invasion of salt water or dust into the electric conducting portion becomes hard, thereby suppressing the occurrence of rust on the electric conducting portion which is a factor contributing to the increase in the electric resistance.

Furthermore, since the intervening member accommodating groove accommodating the intervening member is provided in at least one of the direct-fitting surface of the one cooling plate and the casing direct-fitting surface, the rectifier can be set in the casing in a state where the intervening member is put in the intervening member accommodating groove, with the result that the assembly efficiency is improvable.

Still further, since the intervening member clearance groove is made in at least one of the direct-fitting surface of the one cooling plate and the casing direct-fitting surface to constitute a boundary between the thermal conducting portion and the electric conducting portion, the invasion of the intervening member or material into the electric conducting portion is surely preventable, and the electric conducting portion and the thermal conducting portion are certainly definable between the direct-fitting surface of the one cooling plate and the casing direct-fitting surface.

Besides, since the intervening member is constructed with a sheet-like material excellent in thermal conductivity, the intervening member becomes easy to handle, thereby enhancing the assembly efficiency.

Moreover, since the intervening member is made out of a grease-like material excellent in thermal conductivity, the intervening member can fully be brought closely into contact with the direct-fitting surface of the one cooling plate and the casing direct-fitting surface to improve the thermal conductivity of the thermal conducting portion.

It should be understood that the foregoing relates to only preferred embodiments of the present invention, and that it is intended to cover all changes and modifications of the embodiments of the invention herein used for the purpose of the disclosure, which do not constitute departures from the spirit and scope of the invention.

What is claimed is:

1. An AC generator for a motor vehicle, the AC generator comprising:

a rotor fitted over a shaft rotatably supported within a casing;

a stator attached to said casing to surround said rotor; and a rectifier having a positive-polarity side cooling plate, positive-polarity side one-way conducting devices mounted on a fitting surface of said positive-polarity side cooling plate, a negative-polarity side cooling plate and negative-polarity side one-way conducting devices mounted on a fitting surface of said negative-polarity side cooling plate, said rectifier being fixedly tightened with a fitting screw to said casing in a state where a direct-fitting surface of only one of either said positive-polarity side and said negative-polarity side cooling plates opposite to said fitting surface thereof is brought closely into contact with a casing direct-fitting surface formed on an inner wall surface of said casing and the other of said positive-polarity side and said negative-polarity side cooling plates is not brought closely into contact with said casing direct-fitting surface;

wherein an intervening member providing thermal conductivity is interposed between said direct-fitting surface of said only one of either said positive-polarity side cooling plate and said negative-polarity side cooling plate and said casing direct-fitting surface to cover at least an area right under said one-way conducting devices mounted on said fitting surface of said only one of either said positive-polarity side cooling plate and said negative-polarity side cooling plate to constitute an electric conducting portion at which said direct-fitting surface of said only one of either said positive-polarity side cooling plate and said negative-polarity side cooling plate and said casing direct-fitting surface come directly into contact with each other and a thermal conducting portion at which said direct-fitting surface of said only one of either said positive-polarity side cooling plate and said negative-polarity side cooling plate and said casing direct-fitting surface come into contact with each other in a state where said intervening member is interposed therebetween.

2. An AC generator for a motor vehicle as defined in claim 1, wherein said intervening member is interposed between said direct-fitting surface of said one of said positive-polarity side cooling plate and said negative-polarity side cooling plate and said casing direct-fitting surface so that said thermal conducting portion surrounds said electric conducting portion.

3. An AC generator for a motor vehicle as defined in claim 1, further comprising an intervening member accommodating groove for accommodating said intervening member provided in at least one of said direct-fitting surface of said one of said positive-polarity side cooling plate and said negative-polarity side cooling plate and said casing direct-fitting surface.

4. An AC generator for a motor vehicle as defined in claim 3, further comprising an intervening member clearance groove made in at least one of said direct-fitting surface of said one of said positive-polarity side cooling plate and said negative-polarity side cooling plate and said casing direct-fitting surface so as to constitute a boundary between said thermal conducting portion and said electric conducting portion.

5. An AC generator for a motor vehicle as defined in claim 1, wherein said intervening member is made from a sheet-like material.

6. An AC generator for a motor vehicle as defined in claim 1, wherein said intervening member is made out of a grease-like material.

7. An AC generator as claimed in claim 1, wherein said thermally conductive silicone intervening member has a thermal conductivity of at least 2.5 kcal/mh °C.

8. An AC generator comprising;
- a rotor fitted over a shaft rotatably supported within a casing;
- a stator attached to said casing to surround said rotor; and
- a rectifier having a positive-polarity side cooling plate with a plurality of positive-polarity side one-way conducting devices mounted on a fitting surface of said positive-polarity side cooling plate, a negative-polarity side cooling plate with negative-polarity side one-way conducting devices mounted on a fitting surface of said negative-polarity side cooling plate, said rectifier being attached with a fitting screw to said casing whereby a direct-fitting surface of only one of either said positive-polarity side and said negative-polarity side cooling plates opposite to said fitting surface is brought closely into contact with a casing direct-fitting surface formed on an inner wall surface of said casing;
- wherein a thermally conductive silicone intervening member is interposed between said direct-fitting surface of the one cooling plate brought closely into contact with said casing direct-fitting surface and said casing direct-fitting surface to cover at least an area directly under respective said one-way conducting devices mounted on said fitting surface of the one cooling plate brought closely into contact with said casing direct-fitting surface to constitute
- an electric conducting portion in an area where said direct-fitting surface of the one cooling plate brought closely into contact with said casing direct-fitting sure and said casing direct-fitting surface come directly into contact with each other and
- a thermal conducting portion in an area where said direct-fitting surface of the one cooling plate brought closely into contact with said casing direct-fitting surface and said casing direct-fitting surface come closely into contact with each other with said thermally conductive silicone intervening member interposed therebetween.

* * * * *